(12) United States Patent
Jun et al.

(10) Patent No.: US 9,590,051 B2
(45) Date of Patent: Mar. 7, 2017

(54) HETEROGENEOUS LAYER DEVICE

(71) Applicant: Intel Corporation, Santa Clara, CA (US)

(72) Inventors: Kimin Jun, Hillsboro, OR (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/026,614

(22) PCT Filed: Dec. 18, 2013

(86) PCT No.: PCT/US2013/076197
§ 371 (c)(1),
(2) Date: Apr. 1, 2016

(87) PCT Pub. No.: WO2015/094239
PCT Pub. Date: Jun. 25, 2015

(65) Prior Publication Data
US 2016/0247887 A1    Aug. 25, 2016

(51) Int. Cl.
*H01L 27/02* (2006.01)
*H01L 29/267* (2006.01)
*H01L 29/66* (2006.01)
*H01L 29/775* (2006.01)
*H01L 29/06* (2006.01)
(Continued)

(52) U.S. Cl.
CPC .......... *H01L 29/267* (2013.01); *H01L 27/092* (2013.01); *H01L 29/0673* (2013.01); *H01L 29/0692* (2013.01); *H01L 29/0847* (2013.01); *H01L 29/36* (2013.01); *H01L 29/413* (2013.01); *H01L 29/4175* (2013.01); *H01L 29/66439* (2013.01); *H01L 29/775* (2013.01)

(58) Field of Classification Search
None
See application file for complete search history.

(56) References Cited

U.S. PATENT DOCUMENTS 6,518,592 B1 * 2/2003 Amishiro ........... G01R 31/2621
257/48
9,318,476 B2 * 4/2016 Chen ................... H01L 27/0207
(Continued)

FOREIGN PATENT DOCUMENTS

KR    1020120068057    6/2012

OTHER PUBLICATIONS

International Searching Authority, "Notification of Transmittal of the International Search Report and the Written Opinion of the International Searching Authority," mailed Sep. 17, 2014, in International application No. PCT/US2013/076197.

*Primary Examiner* — Michael Lebentritt
(74) *Attorney, Agent, or Firm* — Trop, Pruner & Hu, P.C.

(57) ABSTRACT

An embodiment includes an apparatus comprising: an N layer comprising an NMOS device having a N channel, source, and drain that are all intersected by a first horizontal axis that is parallel to a substrate; a P layer comprising a PMOS device having a P channel, source, and drain that are all intersected by a second horizontal axis that is parallel to the substrate; a first gate, corresponding to the N channel, which intersects the second horizontal axis; and a second gate, corresponding to the P channel, which intersects the first horizontal axis. Other embodiments are described herein.

25 Claims, 8 Drawing Sheets

(51) Int. Cl.
*H01L 29/08* (2006.01)
*H01L 29/41* (2006.01)
*H01L 27/092* (2006.01)
*H01L 29/36* (2006.01)
*H01L 29/417* (2006.01)

(56) References Cited

U.S. PATENT DOCUMENTS

| | | | |
|---|---|---|---|
| 2003/0136978 A1* | 7/2003 | Takaura | H01L 27/0688 257/210 |
| 2007/0138514 A1* | 6/2007 | Chang | H01L 21/845 257/241 |
| 2007/0154422 A1* | 7/2007 | Hattendorf | A61K 8/02 424/59 |
| 2007/0170507 A1 | 7/2007 | Zhu et al. | |
| 2007/0190741 A1 | 8/2007 | Lindsay | |
| 2012/0043614 A1 | 2/2012 | Choi et al. | |
| 2012/0199813 A1 | 8/2012 | Datta et al. | |
| 2013/0164891 A1 | 6/2013 | Bryant et al. | |
| 2015/0179664 A1* | 6/2015 | Levander | H01L 21/02002 257/76 |
| 2015/0221666 A1* | 8/2015 | Lee | H01L 29/66833 257/66 |
| 2015/0263074 A1* | 9/2015 | Takaki | H01L 27/2481 257/5 |
| 2016/0099211 A1* | 4/2016 | Baek | H01L 27/088 257/774 |
| 2016/0133632 A1* | 5/2016 | Park | H01L 27/0207 257/369 |

\* cited by examiner

HETEROGENEOUS LAYER DEVICE

TECHNICAL FIELD

An embodiment addresses lattice mismatched semiconductor devices.

BACKGROUND

A variety of electronic and optoelectronic devices can be enabled by developing, for example, high quality III-V semiconductors on elemental silicon (Si) substrates or IV semiconductors on Si substrates. Surface layers capable of achieving the performance advantages of III-V or IV materials may host a variety of high performance electronic devices such as CMOS and quantum well (QW) transistors fabricated from extremely high mobility materials such as, but not limited to, indium antimonide (InSb), indium arsenide (InAs), germanium (Ge), and silicon germanium (SiGe). Optical devices, such as lasers, detectors and photovoltaics, as well as electronic devices may also be fabricated from various other direct band gap materials, such as, but not limited to, gallium arsenide (GaAs) and indium gallium arsenide (InGaAs).

The growth of III-V and IV materials upon Si substrates, however, presents many challenges. Crystal defects are generated by lattice mismatch, polar-on-nonpolar mismatch, and thermal mismatch between the III-V semiconductor epitaxial (EPI) layer and the Si semiconductor substrate or the IV semiconductor EPI layer and the Si semiconductor substrate. When the lattice mismatch between the EPI layer and substrate exceeds a few percent, the strain induced by the mismatch becomes too large and defects are generated in the EPI layer. Once the film thickness is greater than the critical thickness (i.e., film is fully strained below this thickness and partially relaxed above this thickness), the strain is relaxed by creating misfit dislocations at the film and substrate interface as well as in the EPI film. The EPI crystal defects may be in the form of threading dislocations, stacking faults and twins. Many defects, particularly threading dislocations and twins, tend to propagate into the "device layer" where the semiconductor device is fabricated. Generally, the severity of defect generation correlates to the amount of lattice mismatch between the III-V semiconductor and the Si substrate or the IV semiconductor and the Si substrate.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1:
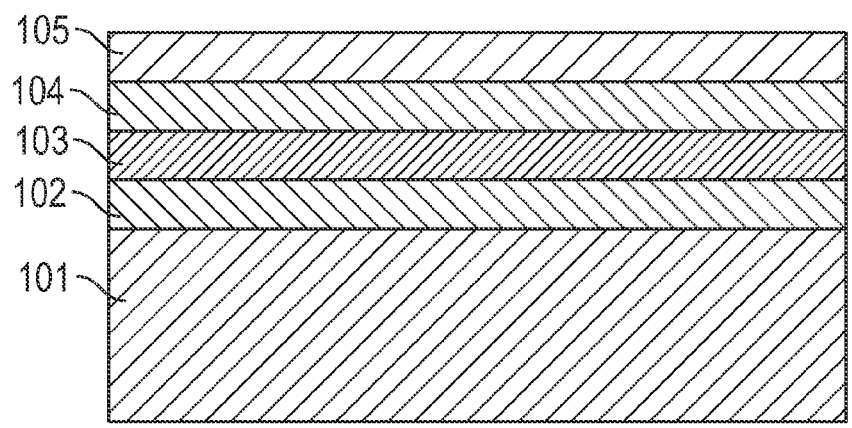
FIGS. 1-4 depict conventional layer transfer processes.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

A conventional technique for managing lattice mismatch includes Aspect Ratio Trapping (ART). ART is based on threading dislocations that propagate upwards at a specific angle. In ART a trench is made in a first semiconductor (S1) with a high enough aspect ratio such that the defects in a second semiconductor (S2) located in the trench terminate on the sidewall of the trench and any layer above the terminations is defect free. The trench may or may not include a barrier.

Another conventional technique to manage defects in lattice mismatched configurations involves deposition of a thick buffer (e.g., 0.5 or more microns thick) that bridges the lattice constant difference between the S1 substrate and the layers of interest (e.g., S2 device layers including III-V materials and the like). In such conventional techniques complicated anneals and compositional grading processes are used to "bend" the defects into each other within the thick buffer so the defects annihilate. Many thick buffer techniques are time consuming, expensive, include undesirable surface roughness of the buffer, and the minimum defect density still remains high.

Further, as scaling progresses and devices get smaller, the space available for a trench or well shrinks. However, the buffer cannot be easily scaled. Therefore, a buffer may need to be coupled with an ART structure. Although ART can reduce the necessary transition layer/buffer thickness, the ART structure itself needs very high aspect ratio patterning. As scaling progresses, the fabrication of the very high aspect ratio structure becomes more difficult as the space available for the structure (e.g., trench) is limited with smaller devices. Also, while there are certain groups of materials which have very similar lattice parameters (e.g., Germanium and Gallium Arsenide), there has been limited success integrating these materials with one another in a heterogeneous manner without use of a buffer (or with using a small buffer).

In addition to ART and buffer based technologies, heterogeneous integration of materials with very different lattice constants may be addressed through a layer transfer process. However, layer transfer has drawbacks as well.

For example, to design devices one needs freedom to access the donor layer that was transferred and/or the receiving layer that received the donor layer. FIG. 1 helps illustrate this issue. In FIG. 1 an N layer (having a majority of electron carriers) 105 is on interlayer dielectric (ILD) 104 (e.g., ILD thickness can be as thin as 10 nm or less), which is on a P layer (having a majority of hole carriers) 103, which is on ILD 102, which is on another layer, such as substrate 101 (or some other layer). Thus, FIG. 1 has one layer dedicated to P type devices (layer 103) and another layer dedicated to N type devices (layer 105).

However, P layer 103 is now covered by ILD 104 and transferred layer 105, thereby making processing of layer 103 more difficult (e.g., forming switching devices, such as diodes and transistors, in layer 103 is more difficult). For example, a transistor needs separate source, drain, and gate controls. Consequently, if a transistor is located in buried layer 103 as well as layer 105 at least three connections or contacts must be made from a metal interconnect (not shown) to the transferred layer 105 for the N device and through the transferred layer 105 and to the buried or receiving layer 103 for the P device. However, unless the transferred layer is deactivated the contact traversing layer 105 may cause shorting or other electrical problems in layer 105 en route to providing power to the P device in layer 103.

Figure 2:
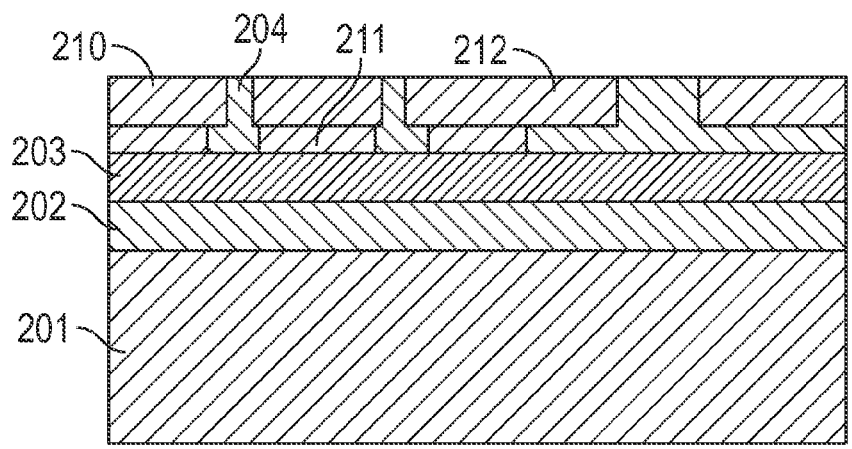

As shown in FIG. 2, an option is to complete the underlying device layer (device fabrication including local interconnect) before layer transfer for the upper layer occurs. For example, after P layer 203 and ILD layers 202, 204 are formed on substrate 201, contact 210 may be formed to access one of the source/drain nodes in P layer 203, contact 211 may be formed as a gate for a channel in P layer 203, and contact 212 may be formed to access another of the source/drain nodes in P layer 203.

Figure 3:
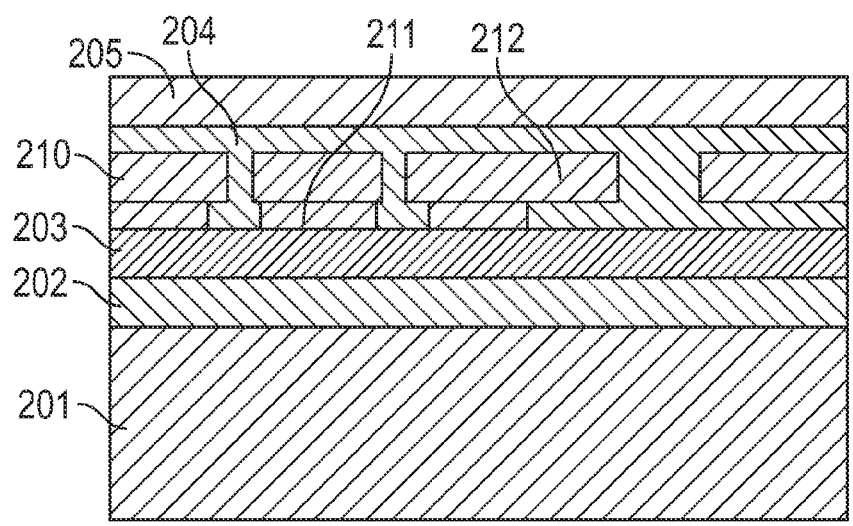
Figure 4:
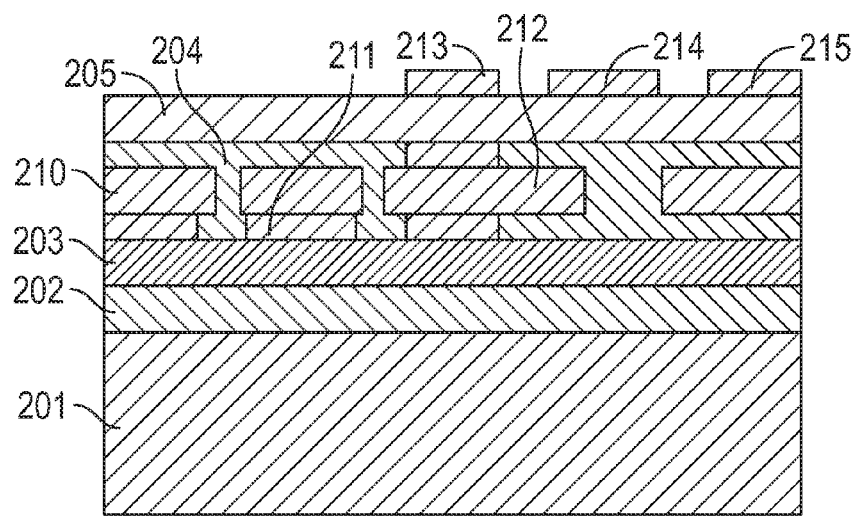

Then, as shown in FIG. 3, upper N layer 205 may be transferred. In FIG. 4, N device formation may commence such that contact 213 may be formed to access one of the source/drain nodes in N layer 205, contact 214 may be formed as a gate for a channel in N layer 205, and contact 215 may be formed to access another of the source/drain nodes in P layer 205. However, this doubles the number of lithography and patterning steps (i.e., one series of steps to pattern the N device and another series of steps to pattern the P device), which is less cost-effective.

In contrast, an embodiment allows selective access to buried and/or transferred layers in a similar manner to conventional in-plane processing. In an embodiment devices (e.g., P-type metal-oxide-semiconductor (PMOS) and N-type metal-oxide-semiconductor (NMOS) devices) are "simultaneously" fabricated on both base/receiving layers (e.g., layer 103) and transferred layers (e.g., layer 105) through single lithography and patterning. By "simultaneously" the process may allow for gates 211, 214 to be formed at the same time or with some overlap (e.g., not necessarily initiating and terminating gate formation at the same time but allowing for some overlap in the formation of the gates). In an embodiment, as will be described below, during gate processing (or some other contact processing) an unnecessary channel may be selectively etched or electrically short circuited ("shorted") to deactivate the unnecessary channel.

In an embodiment, the end product has no additional interconnect layer (such as interconnects 210, 211, 212 in layer 204). Thus, in spite of heterogeneous channel integration, no (or minimal) mask count increases as a result.

FIGS. 5-8 depict a process for heterogeneous channel device fabrication with a single lithography and single patterning step in an embodiment of the invention. The process enables heterogeneous channel device fabrication with a single lithography and single patterning step.

Figure 5:
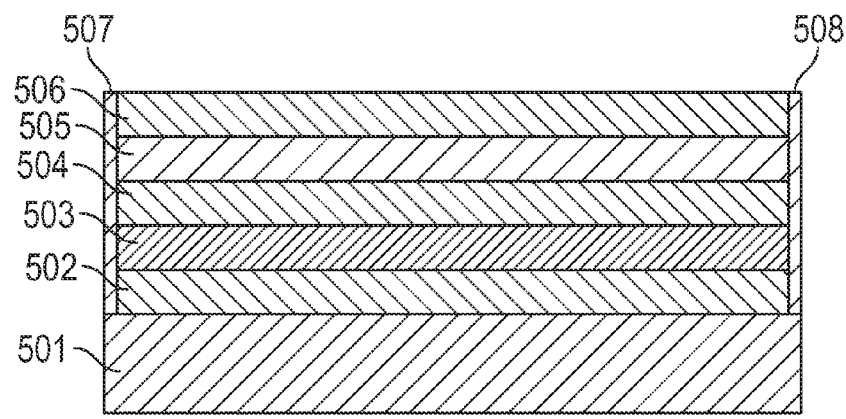
FIGS. 5-8 depict a process for heterogeneous channel device fabrication with a single lithography and a single patterning step in an embodiment of the invention.

FIG. 5 includes ILD 506, N layer 505, ILD 504, P layer 503, ILD 502, and substrate (or some other layer) 501. This includes a channel layer stack because it includes layers 503, 505, which will be used to form devices such as switching devices (e.g., diodes, transistors, and the like). This stack may be located between insulator portions 507, 508 (e.g., shallow trench isolation (STI), oxide, and the like), which were formed within a larger device stack portion to form the portion shown in FIG. 5.

Figure 6:
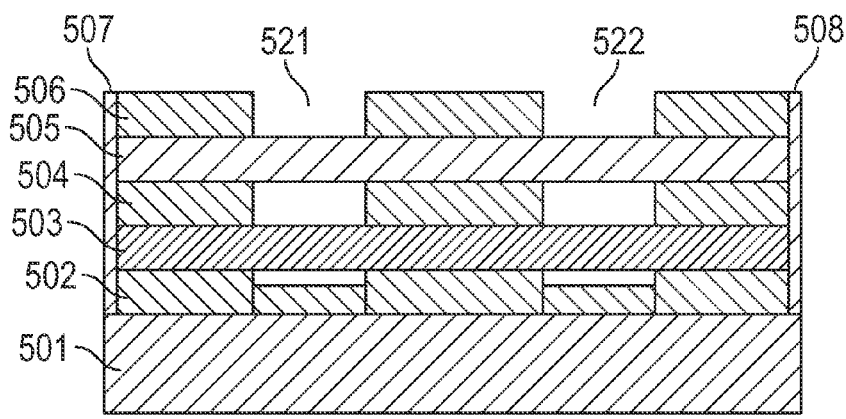
Figure 7:
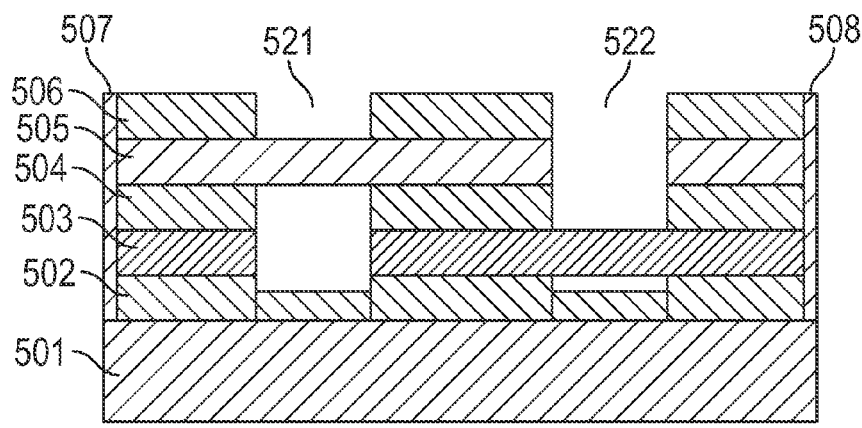
Figure 8:
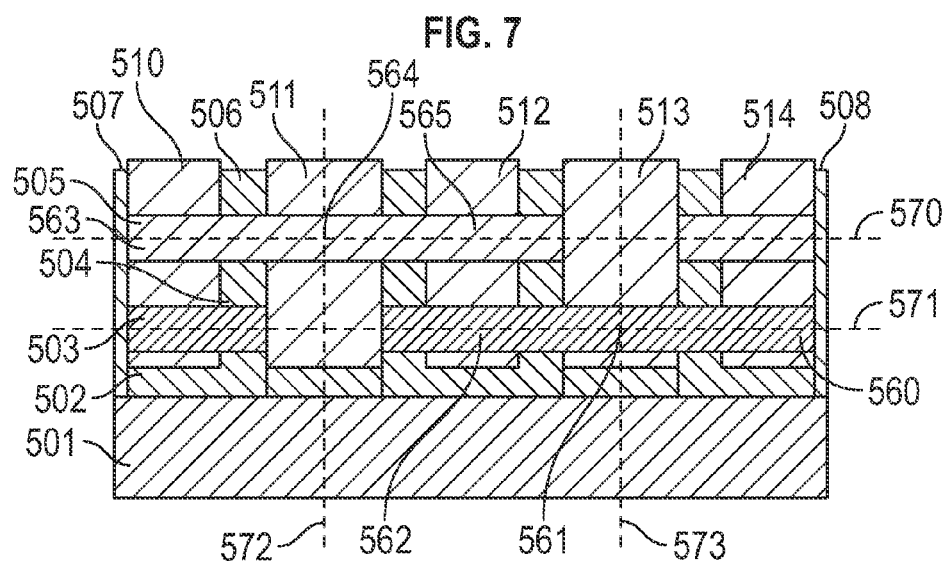

FIG. 6 depicts gate patterning whereby voids 521, 522 are formed (e.g., by etching that is specific to ILD). FIG. 7 depicts selective removal of channel portions. Specifically, a portion of N layer 505 is removed and a portion of P layer 503 is removed. This facilitates gate formation in FIG. 8 such that gate 511 is formed on the top and bottom surfaces of N channel 564 in layer 505 and gate 513 is formed on the top and bottom surfaces of a P channel 561 in layer 503. Contacts 510 (for a source or drain 563 for the N device of layer 505), 512 (for a source or drain for the N and P devices respectively of layers 505, 503, such as drains 565, 562 for those devices), and 514 (for a source or drain 560 for the P device of layer 503) are formed. As shown in FIG. 8, the contacts/gates 510, 511, 512, 513, 514 may wrap around the source/drain (S/D) nodes and may be formed on the top and bottom portions (e.g., similar to a multigate or trigate arrangement) and, in some embodiments, the sides as well (e.g., "all around gate").

Channels 561, 564 may be patterned at the same time/simultaneously so there is no additional lithography step for each channel layer (versus conventional planar devices having N and P devices in a single horizontal layer). Instead, during gate processing unnecessary channels (see FIG. 7) and ILD portions are selectively deactivated. Therefore, only desired channels remain.

Thus, FIG. 8 shows one example of an apparatus comprising: an N layer having an NMOS device having a N channel 564, source 563, and drain 565 that are all intersected by a horizontal axis 570 that is parallel to a substrate 501; and a P layer comprising a PMOS device having a P channel 561, source 560, and drain 562 that are all intersected by a horizontal axis 571 that is parallel to the substrate 501. A gate 511, corresponding to the N channel 563, intersects the horizontal axis 571 despite corresponding to the N channel. Also, gate 513 corresponds to the P channel 561 and intersects the horizontal axis 570.

In an embodiment the N and P layers 503, 505 may comprise first and second materials each selected from the group comprising group IV, III-V, and II-VI. In an embodiment the N and P layers may be lattice mismatched with one another.

In an embodiment the gates may be directly above and directly below the channels they operate with/control. Also, FIG. 8 is simplified and does not include every layer or portion that may be necessary for an operating device. For example, a gate oxide (not shown) may be used between a gate and channel to better operate the channel. Such layers are not illustrated to better focus on concepts such as the ability to simultaneously remove unwanted channels and simultaneously form wanted gates for heterogeneous channels (e.g., N and P channels) in various embodiments of the invention.

In an embodiment at least one of the N and P layers includes an organized single crystal lattice with a bottom surface directly contacting a top surface of an oxide (or other insulator) and the oxide is between the substrate and the at least one of the N and P layers. Thus, despite each of the N and P layers being formed atop amorphous ILD layers 502, 504, due to layer transfer the N and/or P layers may each have a single crystal lattice structure. For example, a single crystal structure may include silicon where the crystal lattice of the entire layer is continuous and unbroken (with no or few grain boundaries) to its edges. It may be prepared intrinsically (i.e., made of pure silicon alone), doped, or contain very small quantities of other elements added to change its semiconducting properties. A monocrystalline layer is opposed to amorphous silicon, in which the atomic order is limited to short range order only.

In other words, due to layer transfer at least one of the N and P layers is transferred to the apparatus and not grown on the apparatus. While in an embodiment multiple device layers (e.g., layers 503, 505) are transferred, in another embodiment only 1 may be transferred (e.g., 505) while the other may be epitaxially grown (e.g., ILD 502 may be removed and layer 503 may be grown atop a buffer, substrate 501, and the like).

As shown in FIG. 8, vertical axis 572, orthogonal to the substrate 501, intersects gate 511 and N channel 564, and vertical axis 573, orthogonal to the substrate 501, intersects gate 513 and P channel 561.

FIGS. 9-15 depict a process for vertical heterogeneous channel device (e.g., a vertically stacked wire device) fabrication in an embodiment of the invention.

Figure 9:
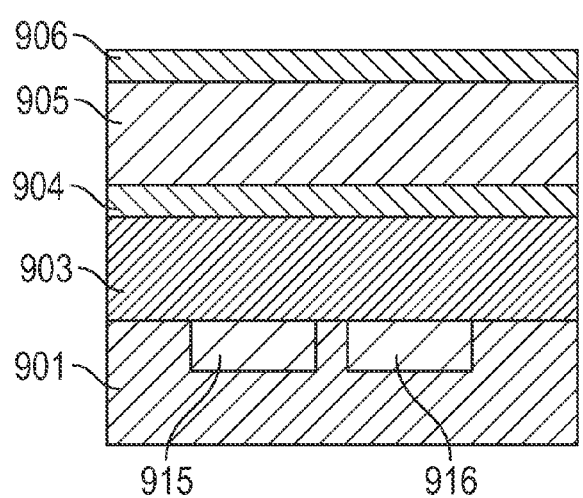
FIGS. 9-15 depict a process for vertical heterogeneous channel device fabrication in an embodiment of the invention.

FIG. 9 includes ILD 906, N layer 905, ILD 904, P layer 903, and substrate (or other layer) 901. In another embodiment an ILD layer may be between layers 901, 903. Buried interconnects 915, 916 may be included within substrate 901 (or some layer between the device layers and a substrate).

Also, with various embodiments the N layer may be disposed above the P layer but in other embodiments the P layer may be above the N layer. While many embodiments show only two device layers other embodiments are not so limited and may include 1, 3, 4, 5, 6 or more device layers. The global patterning and selective deactivation process of FIGS. 9-15 may be extended to other structures, like vertical device integration addressed in FIGS. 16-22 discussed below.

Figure 10:
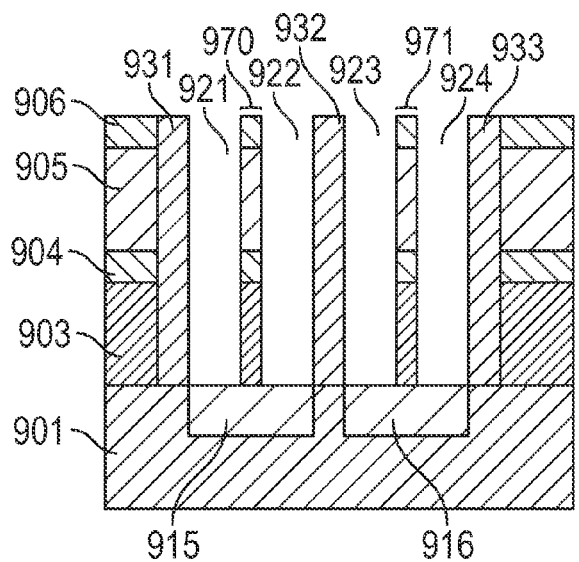
Figure 11:
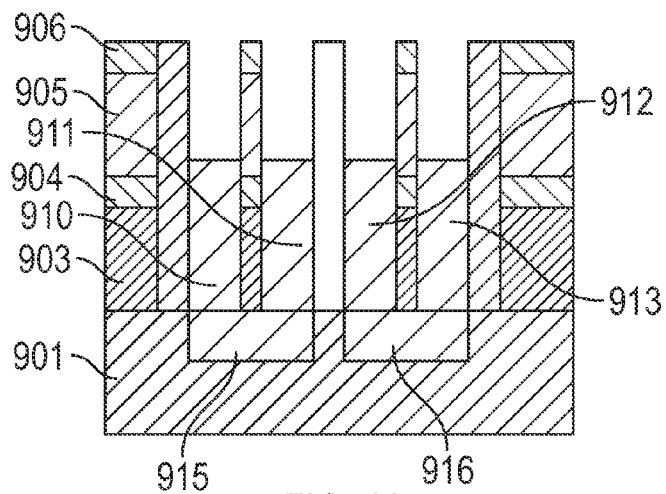
Figure 12:
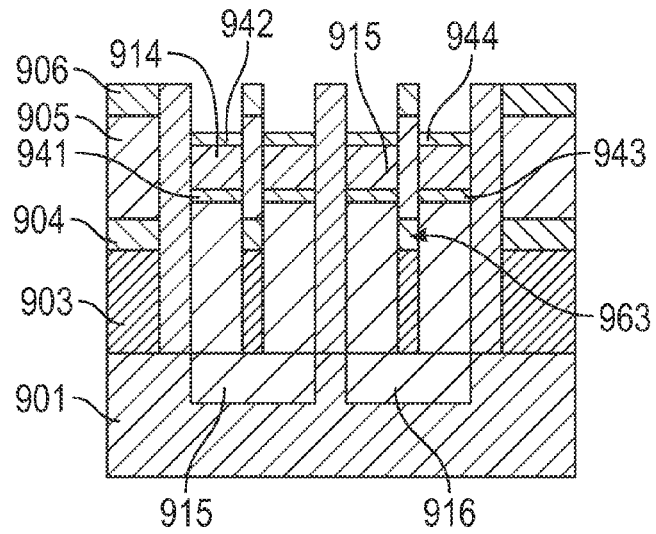

FIG. 10 follows channel layer stacking (FIG. 9) with barrier fabrication based on barriers 931, 932, 933 being formed and then voids 921, 922, 923, 924 being formed. As a result, "wires" 970, 971 are formed (which will later be used to form vertical devices). These barriers and voids may be used in FIG. 11 to form contacts 910, 911, 912, 913. This constitutes a metal fill from buried interconnect portions 915, 916 to wire device drain 963. In FIG. 12 ILD portions 941, 943 are formed, followed by gates 914, 915, and ILD portions 942, 944 to complete N type gate formation.

Figure 13:
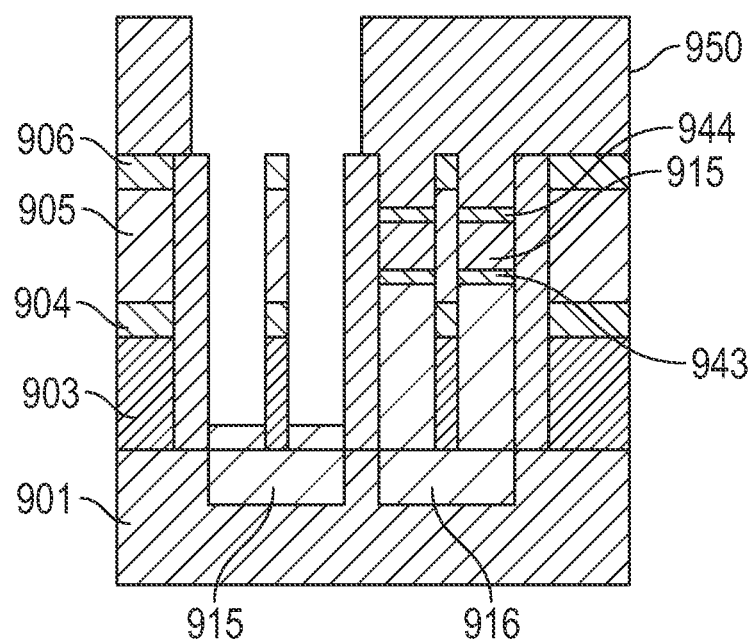
Figure 14:
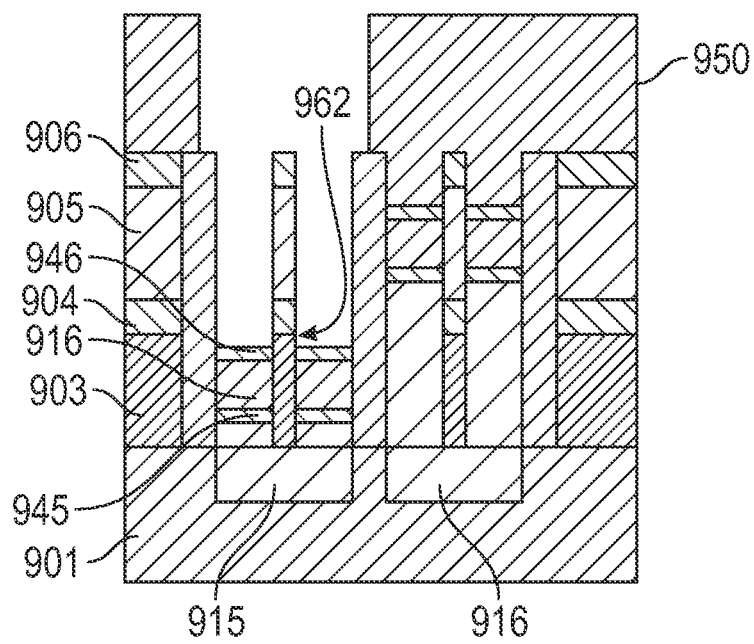
Figure 15:
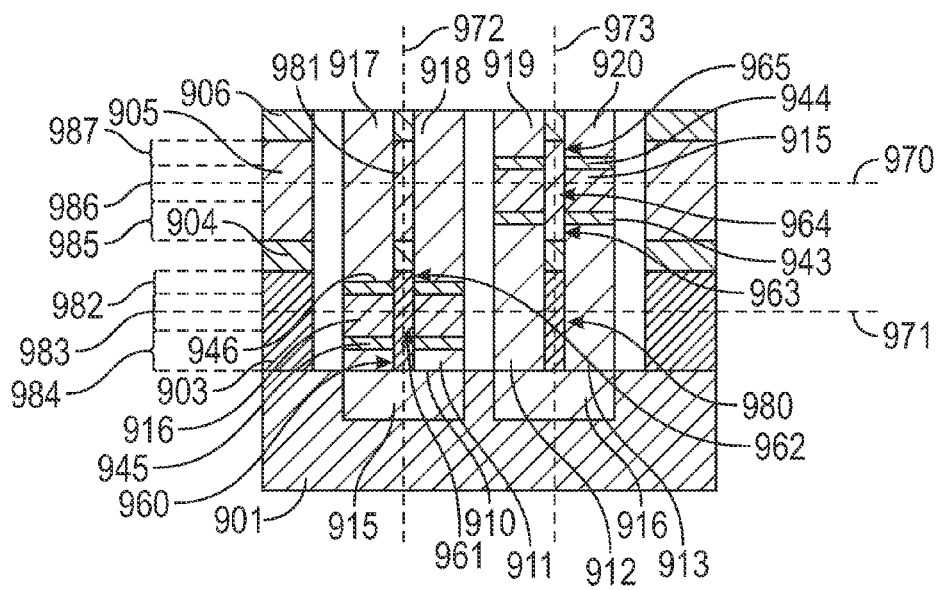

In FIG. 13 metal gate patterning and recess etching (using masking pattern 950) of the P channel metal fill 910, 911 occurs. Then, in FIG. 14 P type gate formation occurs whereby ILD portion 945 is formed, followed by gate 916, and ILD portion 946 to complete P type gate formation. In FIG. 15 this is followed by metal fill from the P wire device source 962 upwards to form contacts 917, 918.

Thus, FIG. 15 depicts an apparatus comprising an N layer comprising an NMOS device having an N channel 964, a source 965, and a drain 963 all intersected by a vertical axis 973 that is orthogonal to a substrate 901. FIG. 15 further includes a P layer comprising a PMOS device having a P channel 961, a source 962, and a drain 960 intersected by a vertical axis 972 that is parallel to the substrate 901. A gate 915 surrounds the N channel 964 (i.e., "all around gate" or multigate) and directly contacts insulation layer 943 and gate 916 surrounds the P channel 961 and directly contacts insulation layer 946. A contact 912 directly contacts insulation layer 943 and a P layer portion 980 and a second contact 917 directly contacts the insulation layer 946 and N layer portion 981.

In an embodiment one or both of the source and drain nodes 963, 965 extends above insulation layer 944/below insulation layer 943 and/or one or both of the source and drain nodes 962, 960 extends above insulation layer 946/below insulation layer 945, thereby helping form the vertically oriented wire devices.

In an embodiment the N layer includes first, second, and third sublayers 985, 986, 987, the second sublayer directly contacting the first and third sublayers, and the second sublayer (for the channel) is more heavily doped than either of the first sublayer (e.g., which includes the drain or source) and third sublayer (e.g., which includes the source or drain). For example, layer 986 may be doped and layers 985, 987 may be undoped (i.e., less doped than layer 986). In an embodiment the P layer includes first, second, and third sublayers 984, 983, 982, the second sublayer directly contacting the first and third sublayers, and the second sublayer (for the channel) is more heavily doped than either of the first sublayer (e.g., which includes the source or drain) and third sublayer (e.g., which includes the drain or source). For example, layer 983 may be doped and layers 982, 984 may be undoped (i.e., less doped than layer 983). The doping for layer 905 (if any) may occur before or after layer 905 is transferred (or grown in some embodiments). The doping for layer 903 (if any) may occur before or after layer 903 is transferred (or grown in some embodiments).

Regarding doping, depending on devices the channel might or might not be heavily doped compared to source/drain. In some embodiments the channel has lower doping than the corresponding source/drain.

In an embodiment horizontal axis 970, parallel to the substrate, intersects the N channel 964 and contacts 918 and/or 917. In an embodiment horizontal axis 971, parallel to the substrate, intersects the P channel 961 and contact 912.

In an embodiment the N and P layers 905, 903 comprise first and second materials each selected from the group comprising group IV, III-V, and II-VI. In an embodiment the N and P layers are lattice mismatched with one another. In an embodiment at least one of the N and P layers includes an organized single crystal lattice (e.g., layer 905) with a bottom surface directly contacting a top surface of an oxide (e.g., layer 904) and the oxide is between the substrate 901 and the at least one of the N and P layers. In an embodiment at least one of the N and P layers (e.g., layer 905) is transferred to the apparatus and not grown on the apparatus.

In the embodiment of FIG. 15 both upper and lower channel wire devices (i.e., devices including channels 964, 961) are fabricated in a single step. Later during dual metal gate processing, any unnecessary channel is deactivated by shorting. For example, wire portion 981 (the upper portion of the left most wire in FIG. 15) has the original capacity to form a device. However, it has no insulation layers (e.g., nothing analogous to layers 943, 944) and thus any source or drain nodes (that could have been formed to fashion an N device) are shorted (short circuited) with any would be N channel portion of 981. Thus, the "unnecessary channel" that could come from an N portion 981 is "deactivated by shorting".

FIGS. 16-22 depict a process for multi-channel conjugated gate device fabrication in an embodiment of the invention. Such a device may include an inverter logic gate having an N and P device that share a drain. Further, instead of etching out either of the channels of the complementary switching devices, both channels are active and controlled by a common gate. In an embodiment a metal layer can be buried under the channel allowing separate contacts on the top and bottom.

Such an inverter circuit outputs a voltage representing the opposite logic-level to its input and is constructed using two complementary transistors in a CMOS configuration (although other inverter embodiments are not so limited). This configuration greatly reduces power consumption since one of the transistors is always off in both logic states. Processing speed can also be improved due to the relatively low resistance compared to the NMOS-only or PMOS-only type devices. Inverters can also be constructed with bipolar junction transistors (BJT) in either a resistor-transistor logic (RTL) or a transistor-transistor logic (TTL) configuration.

Figure 16:
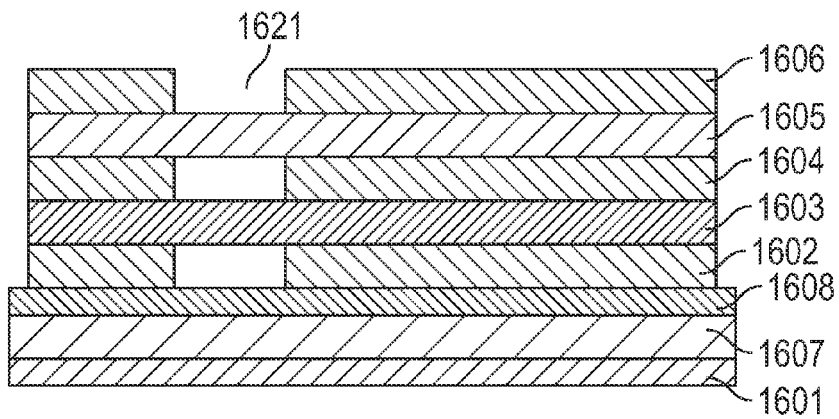
FIGS. 16-22 depict a process for conjugated gate device fabrication in an embodiment of the invention.
Figure 17:
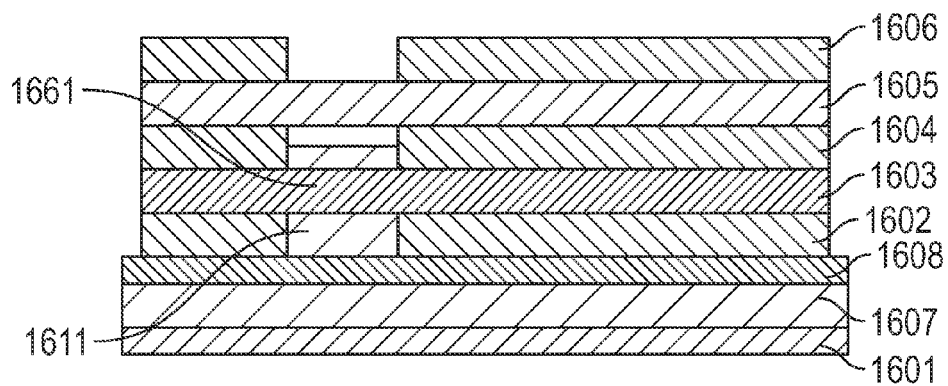
Figure 18:
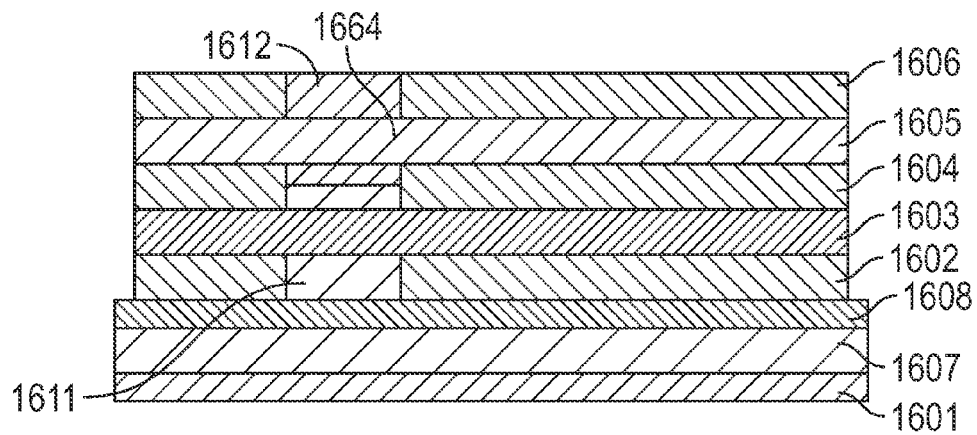

FIG. 16 starts with a channel layer with ILD 1606, P layer 1605, ILD 1604, N layer 1603, ILD 1602, and substrate (or other layer) 1601. A void 1621 for a gate is formed in FIG. 16. In FIG. 17, metal gate filling occurs to form a gate 1611 around horizontal N channel 1661. In FIG. 18, dual metal gate filling occurs to form a dual gate 1612 around horizontal P channel 1664. In an embodiment gates 1611, 1612 may have workfunction values unequal to one another but that is not necessarily the case in all embodiments.

Figure 19:
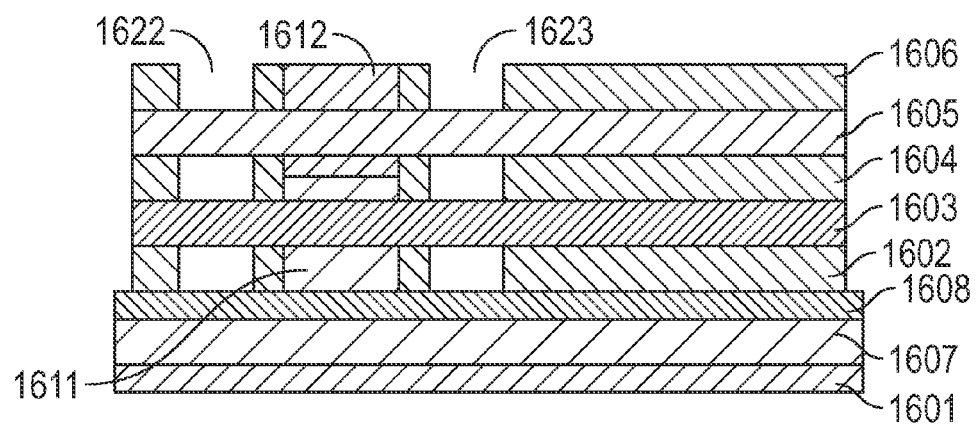
Figure 20:
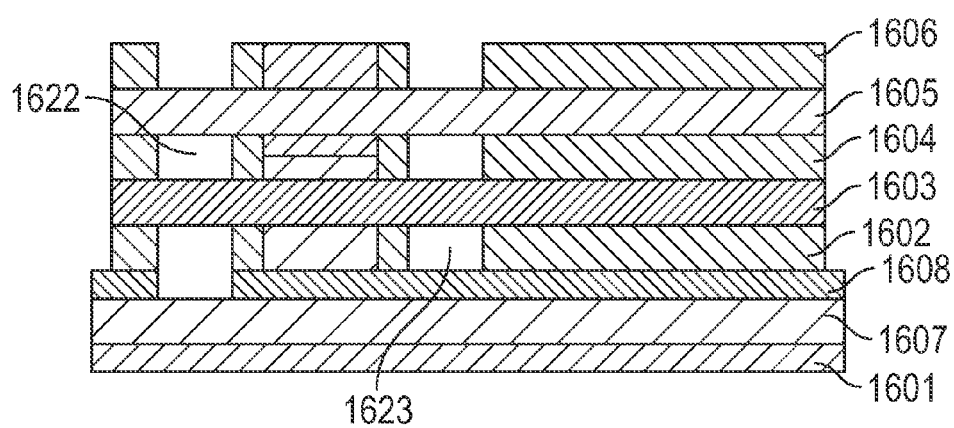
Figure 21:
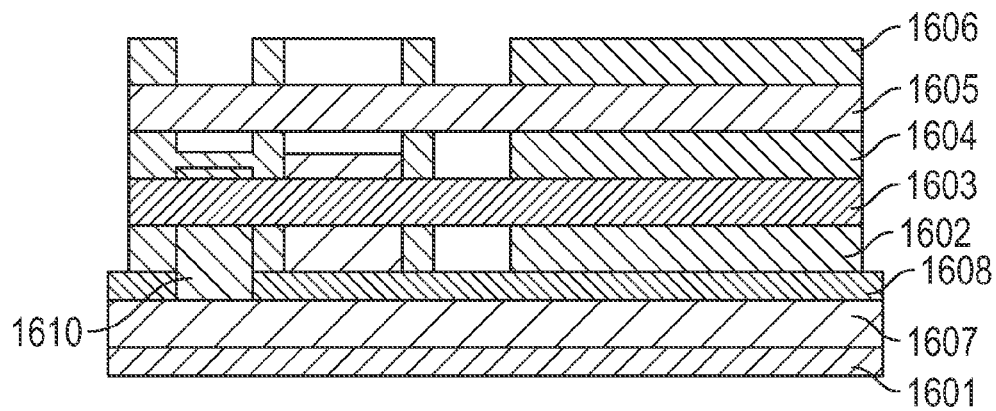

In FIG. 19 contact patterning forms voids 1622, 1623 and in FIG. 20 void 1622 is extended through layer etch stop layer 1608 and to ground plane 1607. Then, the deep contact etch 1622 of FIG. 20 leads to a bottom contact fill 1610 (FIG. 21) and top contact fill 1613 (FIG. 22).

Figure 22:
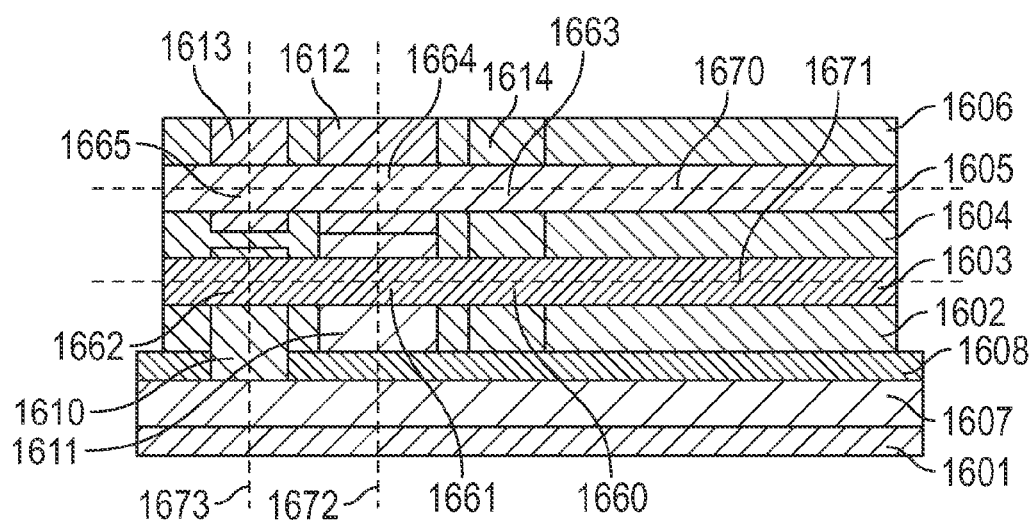

Thus, FIG. 22 depicts an apparatus comprising an N layer 1603 including an NMOS device having an N channel 1661, a source 1662, and a drain 1660 that are all intersected by a horizontal axis 1671 that is parallel to substrate 1601. P layer 1605 comprises a PMOS device having a P channel 1664, a source 1665, and a drain 1663 that are all intersected by a horizontal axis 1670 that is parallel to the substrate 1601. Gate 1612, which corresponds to the P channel, intersects a vertical axis 1672 that intersects a gate 1611, which corresponds to the N channel. Contact 1614 directly contacts drains 1660, 1663. Contact 1610 directly contacts source 1662 and contact 1613 directly contacts source 1665.

In an embodiment, vertical axis 1673, orthogonal to the substrate 1601, intersects contacts 1610 and 1613.

In an embodiment the N and P layers 1603, 1605 are lattice mismatched with one another. In an embodiment at least one of the N and P layers includes an organized single crystal lattice (e.g., layer 1605) with a bottom surface directly contacting a top surface of an oxide (e.g., layer 1604) and the oxide is between the substrate and the at least one of the N and P layers. Thus, at least one of the N and P layers (e.g., layer 1605) is transferred to the apparatus and not grown on the apparatus.

Thus, supplying a digital high value (VIN, or "input", supplied by way of interconnects not shown in FIG. 22) to gates 1611, 1612 activates the P device (and not the N device) thereby coupling the output (VOUT) on mutual drain contact 1614 to the source of the N device, which is coupled (using contact 1610) to ground plane 1607 (e.g., Vss). Supplying a digital low value VIN to gates 1611, 1612 activates the P device (and not the N device) thereby coupling the VOUT on mutual drain contact 1614 to the source of the P device, which is coupled (using contact 1613 and interconnects not shown in FIG. 22) to a high value (e.g., Vdd). Thus when a high value is input a low value is output and when low value is input a high value is output (i.e., the input is "inverted" using the inverter).

An inverter such as the embodiment shown in FIG. 22 is a basic building block for many digital electronics. For example, a memory (1-bit register) may be built as a latch by feeding the output of two inverters to each other's input. Multiplexers, decoders, state machines, and other sophisticated digital devices all may use an inverter such as the inverter of FIG. 22. The inverter of FIG. 22 provides a space savings due to its compact vertical orientation.

When a layer is transferred in an embodiment, various layer transfer techniques may be used. For example, a donor wafer (S2) and ILD are transferred to a receiving wafer (S1). For example, device and ILD layers may be transferred with an appropriate layer transfer/bonding technique, such as a substrate SiGe On Insulator (SGOT) process where a relaxed SiGe substrate is prepared by growing SiGe on a bulk substrate by an appropriate process and then transferring a relaxed top layer of the SiGe to a different substrate (e.g., such as to the S1 substrate base, which may be a silicon oxide wafer).

Another example for layer transfer includes a process where an ILD, such as an oxide, is first grown thermally on a S2 wafer, resulting in an oxide-silicon interface. Next, a high dose of hydrogen (e.g., $5 \times 10^{16}$ ions/cm$^2$) is implanted to form a release interface in the S2 wafer. Then, the oxide on the S2 wafer is chemically bonded to a surface of the S1 wafer to form a buried oxide that is embedded between the S1 and S2 wafers. After activating the hydrogen thermally at about 500 degrees Centigrade to form voids in the release interface, a portion of the seed wafer that is located below the release interface is removed, or cleaved off, leaving behind the S2 body attached to a buried oxide. Then, the bonded structure is subjected to an anneal at a moderate temperature of about 1,100 degrees Centigrade. Finally, a chemical-mechanical polish (CMP) process is performed to smooth the cleaved surface.

Other embodiments may use other layer transfer processes wherein, for example, a plasma immersion ion implantation (PIII) process may be used to form the release interface, a low-power plasma process is used at room temperature to chemically bond the oxide on the receiving wafer to the donor wafer, and then a pressurized air burst, such as at room temperature, is used to initiate a crack in the release interface, and then a chemical vapor etch is performed to finish the release interface.

The N and P layers described above (e.g., FIGS. 8, 15, 22) may, in various embodiments, each include differing IV, III-V, and II-VI materials such as Ge, SiGe, GaAs, AlGaAs, InGaAs, InAs, and InSb. The lattice mismatch between the two layers may be less than 1% or 2, 3, 4, 5, 6, 7, 8, 9, 10, 11, 12% or more.

Example 1 includes an apparatus comprising an N layer comprising an NMOS device having a N channel, source, and drain that are all intersected by a first horizontal axis that is parallel to a substrate; a P layer comprising a PMOS device having a P channel, source, and drain that are all intersected by a second horizontal axis that is parallel to the substrate; a first gate, corresponding to the N channel, which intersects the second horizontal axis; and a second gate, corresponding to the P channel, which intersects the first horizontal axis.

In example 2 the subject matter of the Example 1 can optionally include wherein the N and P layers comprise first and second materials each selected from the group comprising group IV, III-V, and II-VI.

In example 3 the subject matter of the Examples 1-2 can optionally include wherein the N and P layers are lattice mismatched with one another.

In example 4 the subject matter of the Examples 1-3 can optionally include wherein the first gate is directly above and directly below the N channel and second gate is directly above and directly below the P channel.

In example 5 the subject matter of the Examples 1-4 can optionally include wherein at least one of the N and P layers includes an organized single crystal lattice with a bottom surface directly contacting a top surface of an oxide and the oxide is between the substrate and the at least one of the N and P layers.

In example 6 the subject matter of the Examples 1-5 can optionally include wherein at least one of the N and P layers is transferred to the apparatus and not grown on the apparatus.

In example 7 the subject matter of the Examples 1-6 can optionally include a first vertical axis, orthogonal to the substrate, which intersects the first gate and the N channel, and a second vertical axis, orthogonal to the substrate, which intersects the second gate and the P channel.

In example 8 the subject matter of the Examples 1-7 can optionally include wherein an insulator portion directly contacts both of the N and P layers.

Example 9 includes an apparatus comprising: an N layer comprising an NMOS device having a, N channel, a first source, and a first drain all intersected by a first vertical axis that is orthogonal to a substrate; a P layer comprising a PMOS device having a P channel, a second source, and a second drain intersected by a second vertical axis that is parallel to the substrate; a first gate, surrounding the N channel, directly contacting a first insulation layer; a second gate, surrounding the P channel, directly contacting a second insulation layer; a first contact directly contacting the first insulation layer and the P layer; and a second contact directly contacting the second insulation layer and the N layer.

In example 10 the subject matter of the Example 9 can optionally include wherein one of the first source and first drain extends above the first insulation layer and another of the first source and first drain extends below the first insulation layer.

In example 11 the subject matter of the Examples 9-10 can optionally include wherein one of the second source and second drain extends above the second insulation layer and another of the second source and second drain extends below the second insulation layer.

In example 12 the subject matter of the Examples 9-11 can optionally include wherein (a) at least one of the N and P layers includes first, second, and third sublayers, the second sublayer directly contacting the first and third sublayers, and (b) the second sublayer is unequally doped to at least one of the first and third sublayers.

In example 13 the subject matter of the Examples 9-12 can optionally include wherein at least one of the N and P channels includes a portion of the second sublayer, at least one of the first and second sources includes a portion of the first sublayer, and at least one of the first and second drains includes a portion of the third sublayer.

In example 14 the subject matter of the Examples 9-13 can optionally include comprising a first horizontal axis, parallel to the substrate, intersecting the N channel and the second contact.

In example 15 the subject matter of the Examples 9-14 can optionally include a second horizontal axis, parallel to the substrate, intersecting the P channel and the first contact.

In example 16 the subject matter of the Examples 9-15 can optionally include wherein the N and P layers comprise first and second materials each selected from the group comprising group IV, III-V, and II-VI.

In example 17 the subject matter of the Examples 9-16 can optionally include wherein the N and P layers are lattice mismatched with one another.

In example 18 the subject matter of the Examples 9-17 can optionally include wherein at least one of the N and P layers includes an organized single crystal lattice with a bottom surface directly contacting a top surface of an oxide and the oxide is between the substrate and the at least one of the N and P layers.

In example 19 the subject matter of the Examples 9-18 can optionally include wherein at least one of the N and P layers is transferred to the apparatus and not grown on the apparatus.

Example 20 includes an N layer comprising an NMOS device having a N channel, a first source, and a first drain that are all intersected by a first horizontal axis that is parallel to a substrate; a P layer comprising a PMOS device having a P channel, a second source, and a second drain that are all intersected by a second horizontal axis that is parallel to the substrate; and a first gate, which corresponds to the N channel, intersecting a vertical axis that intersects a second gate, which corresponds to the P channel; and a first contact directly contacting the first and second drains.

In example 21 the subject matter of Example 20 can optionally include a second contact, which directly contacts the first source, and a third contact, which directly contacts the second source.

In example 22 the subject matter of the Examples 20-21 can optionally include a vertical axis, orthogonal to the substrate, intersecting the second and third contacts.

In example 23 the subject matter of the Examples 20-22 can optionally include wherein the second and third contacts include materials having unequal workfunctions.

In example 24 the subject matter of the Examples 20-23 can optionally include wherein the N and P layers are lattice mismatched with one another.

In example 25 the subject matter of the Examples 20-24 can optionally include wherein the apparatus is an inverter.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   an N layer comprising an NMOS device having an N channel, source, and drain that are all intersected by a first horizontal axis that is parallel to a substrate;
   a P layer comprising a PMOS device having a P channel, source, and drain that are all intersected by a second horizontal axis that is parallel to the substrate;
   a first gate, corresponding to the N channel, which intersects the second horizontal axis; and
   a second gate, corresponding to the P channel, which intersects the first horizontal axis.

2. The apparatus of claim 1, wherein the N and P layers comprise first and second materials each selected from the group comprising group IV, III-V, and II-VI.

3. The apparatus of claim 1, wherein the N and P layers are lattice mismatched with one another.

4. The apparatus of claim 1, wherein the first gate is directly above and directly below the N channel and the second gate is directly above and directly below the P channel.

5. The apparatus of claim 1, wherein at least one of the N and P layers includes an organized single crystal lattice with a bottom surface directly contacting a top surface of an oxide and the oxide is between the substrate and the at least one of the N and P layers.

6. The apparatus of claim 1, wherein at least one of the N and P layers is transferred to the apparatus and not grown on the apparatus.

7. The apparatus of claim 1 comprising a first vertical axis, orthogonal to the substrate, which intersects the first gate and the N channel, and a second vertical axis, orthogonal to the substrate, which intersects the second gate and the P channel.

8. The apparatus of claim 1, wherein an insulator portion directly contacts both of the N and P layers.

9. An apparatus comprising:
   an N layer comprising an NMOS device having an N channel, a first source, and a first drain all intersected by a first vertical axis that is orthogonal to a substrate;
   a P layer comprising a PMOS device having a P channel, a second source, and a second drain intersected by a second vertical axis that is parallel to the substrate;
   a first gate, surrounding the N channel, directly contacting a first insulation layer;
   a second gate, surrounding the P channel, directly contacting a second insulation layer;
   a first contact directly contacting the first insulation layer and the P layer; and
   a second contact directly contacting the second insulation layer and the N layer.

10. The apparatus of claim 9, wherein one of the first source and first drain extends above the first insulation layer and another of the first source and first drain extends below the first insulation layer.

11. The apparatus of claim 10, wherein one of the second source and second drain extends above the second insulation layer and another of the second source and second drain extends below the second insulation layer.

12. The apparatus of claim 9, wherein (a) at least one of the N and P layers includes first, second, and third sublayers, the second sublayer directly contacting the first and third sublayers, and (b) the second sublayer is unequally doped to at least one of the first and third sublayers.

13. The apparatus of claim 12, wherein at least one of the N and P channels includes a portion of the second sublayer, at least one of the first and second sources includes a portion of the first sublayer, and at least one of the first and second drains includes a portion of the third sublayer.

14. The apparatus of claim 9 comprising a first horizontal axis, parallel to the substrate, intersecting the N channel and the second contact.

15. The apparatus of claim 14 comprising a second horizontal axis, parallel to the substrate, intersecting the P channel and the first contact.

16. The apparatus of claim 9, wherein the N and P layers comprise first and second materials each selected from the group comprising group IV, III-V, and II-VI.

17. The apparatus of claim 9, wherein the N and P layers are lattice mismatched with one another.

18. The apparatus of claim 9, wherein at least one of the N and P layers includes an organized single crystal lattice with a bottom surface directly contacting a top surface of an oxide and the oxide is between the substrate and the at least one of the N and P layers.

19. The apparatus of claim 9, wherein at least one of the N and P layers is transferred to the apparatus and not grown on the apparatus.

20. An apparatus comprising:
   an N layer comprising an NMOS device having an N channel, a first source, and a first drain that are all intersected by a first horizontal axis that is parallel to a substrate;
   a P layer comprising a PMOS device having a P channel, a second source, and a second drain that are all intersected by a second horizontal axis that is parallel to the substrate; and
   a first gate, which corresponds to the N channel, intersecting a vertical axis that intersects a second gate, which corresponds to the P channel; and
   a first contact directly contacts the first and second drains.

21. The apparatus of claim 20 comprising a second contact, which directly contacts the first source, and a third contact, which directly contacts the second source.

22. The apparatus of claim 21 comprising a vertical axis, orthogonal to the substrate, intersecting the second and third contacts.

23. The apparatus of claim 21 wherein the second and third contacts include materials having unequal workfunctions.

24. The apparatus of claim 21, wherein the N and P layers are lattice mismatched with one another.

25. The apparatus of claim 21, wherein the apparatus is an inverter.

* * * * *